(12) United States Patent
Brothier et al.

(10) Patent No.: US 10,068,674 B2
(45) Date of Patent: Sep. 4, 2018

(54) JET SPOUTED BED TYPE REACTOR DEVICE HAVING A SPECIFIC PROFILE FOR CVD

(75) Inventors: Meryl Brothier, Aix en Provence (FR); Dominique Moulinier, Pierre-Vert (FR); Philippe Rodriguez, Rives (FR); Carine Ablitzer, Saint-Julien le Montagnier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/129,916

(22) PCT Filed: Jun. 28, 2012

(86) PCT No.: PCT/EP2012/062609
§ 371 (c)(1),
(2), (4) Date: Dec. 27, 2013

(87) PCT Pub. No.: WO2013/001024
PCT Pub. Date: Jan. 3, 2013

(65) Prior Publication Data
US 2014/0193570 A1   Jul. 10, 2014

(30) Foreign Application Priority Data
Jun. 28, 2011   (FR) .................... 11 55760

(51) Int. Cl.
*G21C 3/20*    (2006.01)
*C23C 16/455*  (2006.01)
(Continued)

(52) U.S. Cl.
CPC .............. *G21C 3/20* (2013.01); *C23C 16/442* (2013.01); *C23C 16/4417* (2013.01);
(Continued)

(58) Field of Classification Search
CPC .......... G21C 3/20; G21C 3/623; G21C 21/02; C23C 16/455; C23C 16/4417; C23C 16/442; Y02E 30/38
(Continued)

(56) References Cited

U.S. PATENT DOCUMENTS 3,551,513 A * 12/1970 Niwa ............... B01J 8/245
                                              208/127
4,271,207 A   6/1981 Löser et al.
(Continued)

FOREIGN PATENT DOCUMENTS

CA         601607 A    7/1960
CN      101830627 A    8/2011
(Continued)

OTHER PUBLICATIONS

Pranati Sahoo et al, Fluidization and Sprouting of Fine Particles: A Comparison, Sep. 30, 2013, Hindawi Publishing Corp.*
(Continued)

*Primary Examiner* — Jeffrie Robert Lund
(74) *Attorney, Agent, or Firm* — Pearne & Gordon LLP (57) ABSTRACT

The invention relates to a jet spouted bed reactor, comprising a cylindrical area, a gas injection pipe at the base of the cylindrical area, and a transition area, connecting the upper end of the pipe to the base of the cylindrical area, this transition area having a convex profile in a plane extending through the axis (YY') of flow of a fluid in the pipe.

8 Claims, 5 Drawing Sheets

(51) Int. Cl.
G21C 21/02 (2006.01)
G21C 3/62 (2006.01)
C23C 16/442 (2006.01)
C23C 16/44 (2006.01)

(52) U.S. Cl.
CPC ............ *C23C 16/455* (2013.01); *G21C 3/623* (2013.01); *G21C 21/02* (2013.01); *Y02E 30/38* (2013.01)

(58) Field of Classification Search
USPC .......................................................... 715/716
See application file for complete search history.

(56) References Cited

U.S. PATENT DOCUMENTS

| | | | | |
|---|---|---|---|---|
| 4,342,284 | A | * | 8/1982 | Loser .................... C23C 16/442 118/716 |
| 4,358,433 | A | * | 11/1982 | Pircon .................... B01D 45/08 261/116 |
| 4,863,699 | A | * | 9/1989 | Shaw ........................ B01J 8/18 422/143 |
| 5,068,979 | A | * | 12/1991 | Wireman ................ F26B 17/22 34/58 |
| 5,407,647 | A | * | 4/1995 | Tarancon ............... B01D 53/74 422/140 |
| 5,622,677 | A | * | 4/1997 | Hadjigeorge .......... B01J 8/1845 208/155 |
| 5,809,664 | A | * | 9/1998 | Legros .................... F26B 3/088 159/4.01 |
| 6,395,197 | B1 | * | 5/2002 | Detering ................ B01J 19/088 252/373 |
| 6,441,108 | B1 | * | 8/2002 | Haendeler ............. B01J 8/1872 422/132 |
| 6,607,768 | B1 | * | 8/2003 | Eichner .................. A23F 5/046 34/360 |
| 6,993,856 | B2 | * | 2/2006 | Benali .................... F26B 3/0926 34/174 |
| 2005/0148479 | A1 | * | 7/2005 | Barthel ............... A47L 15/4445 510/101 |
| 2008/0035056 | A1 | | 2/2008 | Okubo et al. |
| 2008/0220166 | A1 | | 9/2008 | Ege et al. |
| 2009/0064580 | A1 | * | 3/2009 | Nicoll .................... B01J 8/1818 48/77 |
| 2009/0149620 | A1 | | 6/2009 | Sato et al. |
| 2009/0323756 | A1 | * | 12/2009 | Tenzek ..................... H05B 6/24 373/138 |
| 2010/0310982 | A1 | * | 12/2010 | Ohtani .................. G03G 9/1136 430/111.32 |
| 2012/0006744 | A1 | * | 1/2012 | Phattaranawik ........ C02F 3/301 210/605 |
| 2012/0085284 | A1 | * | 4/2012 | Dassel ..................... B01J 8/002 118/716 |
| 2012/0193586 | A1 | * | 8/2012 | Nakamura .............. C08L 69/00 252/511 |
| 2012/0234942 | A1 | * | 9/2012 | Unosawa ................ B01J 2/006 239/291 |
| 2014/0193570 | A1 | * | 7/2014 | Brothier .............. C23C 16/4417 427/6 |

FOREIGN PATENT DOCUMENTS

| | | | |
|---|---|---|---|
| DE | 437970 | | 12/1926 |
| EP | 1550502 | A1 | 7/2005 |
| EP | 1752991 | B1 | 11/2012 |
| FR | 2354611 | A1 | 1/1978 |
| FR | 2526677 | A1 * | 11/1983 ............ B01J 8/1827 |
| GB | 1567256 | | 5/1980 |
| JP | 56-108526 | A | 8/1981 |
| JP | 56108526 | A * | 8/1981 ................ B01J 8/22 |
| JP | S 56-108526 | A | 8/1981 |
| JP | 56-111036 | A | 9/1981 |
| JP | 56111036 | A * | 9/1981 |
| JP | S 56-111036 | A | 9/1981 |
| JP | S 58-207940 | A | 12/1983 |
| JP | 2005-337947 | A | 12/2005 |
| JP | 2009-502704 | | 1/2009 |
| RU | 2377487 | C1 | 12/2009 |

OTHER PUBLICATIONS

Machine translation of JP 56-111036A, published Sep. 2, 1981.*
Mathur, K. B., et al., "A Technique for contacting gases with coarse solid particles," A.I.Ch.E. Journal, vol. 1, No. 2, Jun. 1955, pp. 157-164.
Shakourzadeh, K., "Calcul des Reacteurs a Lits Fluidises", Techniques de l'Ingenieur, J4100, Mar. 10, 1992, 18 pages.
French Search Report for French Application No. 1155760, dated Feb. 14, 2012.
International Search Report for PCT/EP2012/062609 dated Aug. 2, 2012.
International Preliminary Report on Patentability for PCT/EP2012/062609 dated Sep. 25, 2013.
Geldart, D., "Types of Gas Fluidization," Powder Technology, May 1, 1973, pp. 285-292, vol. 7, No. 5.
Miller, Kalman J., et al. "Gas-Solids Mixing and Heat Transfer Studies in Incipiently Fluidized Beds of Nonuniform Cross-Sectional Area," I & EC Process Design and Development; vol. 8 No. 2, Apr. 1969; 3 pps.
JP 2014-517711 Japanese Patent Application No., Office Action dated Jun. 14, 2016.
European Search Report dated Jun. 28, 2012 of the European International Application No. PCT/EP2012/062609.
Indian Office Action for Application No. 2430/MUMNP/2013, dated Mar. 21, 2018.
Canadian Office Action for Application No. CA 2,840,254, dated May 7, 2018 and translation.

* cited by examiner

JET SPOUTED BED TYPE REACTOR DEVICE HAVING A SPECIFIC PROFILE FOR CVD

CROSS REFERENCE TO RELATED APPLICATIONS

This application is the national stage of International Application No. PCT/EP2012/062609, filed Jun. 28, 2012, entitled, "Jet-Spouted Bed Reactor Having A Specific Profile," which claims the benefit of priority of French Patent Application No. 11 55760, filed Jun. 28, 2011, the contents of which are incorporated herein by reference in its entirety.

TECHNICAL FIELD AND PRIOR ART

Within the scope of methods implementing a deposition on powders or particles by techniques of the type known as CVD (Chemical Vapour Deposition), it is sometimes necessary, depending on the characteristics of the granular material on which it is wished to carry out the deposition, to implement a fluidisation by jet spouted bed. This implementation enables an efficient mixing (and thus a homogeneous deposition) of the bed of powder despite the difficulty of fluidising the latter. The present invention proposes a specific conception of jet spouted bed reactor enabling an improvement of the control of the deposition conditions for cases inducing a significant modification of the characteristics of the bed by the very fact of this deposition. This is typically the case of jet spouted bed type reactors dedicated to the elaboration of fuel particles that can be used (TRISO particles) for HTR (High Temperature Reactor) type reactors.

It will be recalled firstly that jet spouted beds induce the formation of a fountain above a bed of particles. This technique is thus very different to that of the fluidised bed, which only causes a relatively homogeneous mixing of a bed of particles. Jet spouted bed type reactors, on the one hand, and fluidised bed type reactors, on the other hand, thus do not at all have the same hydrodynamics, are not optimised in the same way and the optimisation of one of the 2 types does not enable the optimisation of the other type.

The first jet spouted beds were described by Mathur and Gishler (Mathur, K. B., Gishler, P. E., A.1.Ch.E. J. 1, 157 (1955)).

Fluidised bed reactors are described for example in *Techniques de l'Ingénieur* (Fluidised bed reactor calculation, J4100, 10 Mar. 1992 Khalil Shakourzadeh) and one of the first patents describing this type of reactor is for example the German patent DE 437,970 (1922) of F. Winkler.

The fluidisation of granular charges (known as bed) is a very satisfactory method for bringing into contact a gas and these charges within the scope of industrial methods in very multiple applications (drying, coating, catalytic reaction, etc.).

This phenomenon of fluidisation is not however easy for all types of particles, as has been shown by Geldart in his classification of powders (Geldart D. (1973), Powder Technology. Vol. 7, p 285).

Figure 8:
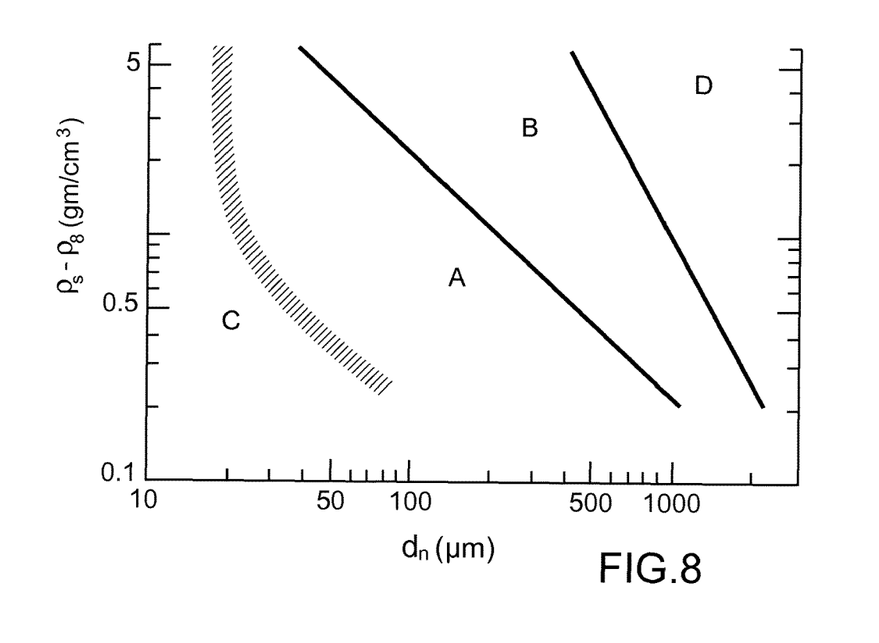

The graph of FIG. 8 resumes this classification: one finds, on the Y-axis, the difference in specific mass between the fluidisation gas and the powder to be fluidised and, on the X-axis, the average diameter of the powder considered.

One may distinguish in this graph powders:
of the area A, which correspond to powders relatively easy to fluidise, i.e. with a homogeneous fluidisation (without large bubbles in the fluidised bed),
of the area B, which is that of powders which can be fully fluidised,
of the area C, which corresponds to cohesive powders, very difficult to fluidise: these powders do not come into movement in a homogeneous manner in the bed, which results in important variations of the head loss, in the bed, for flow rates nevertheless very similar or equivalent, according to the fluidisation tests,
of the area D, which is that of relatively dense powders, which can be fluidised in the favoured conditions of a jet spouted bed.

For particles known as type D (particles of large diameters and high densities) in this classification, the fluidisation is conventionally implemented by means of a jet spouted bed reactor. In this type of bed, the gas enabling the fluidisation of the charge is introduced in the lower part, leading to a periodic movement and the formation of a fountain, hence the name of jet spouted bed.

Different types of bed are known.

Figure 1A:
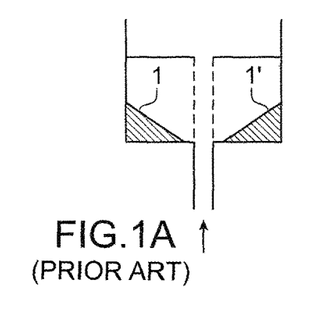
FIGS. 1A-1C are schematic views, in transversal section, of known systems.

Jet spouted beds are known with a right angle profile, the simplest embodiment that exists, because the injection of gas is assured by an injector at the level of a cylindrical section. This type of profile, represented schematically in FIG. 1A, is not optimised from the point of view of the fluidisation of the granular charge, since it leads to important dead volumes, in other words areas 1, 1' in which the passage times of the particles are very long, compared to the average of the other areas of the bed. In this sense, the right angle configuration type is virtually not used industrially.

Figure 1B:
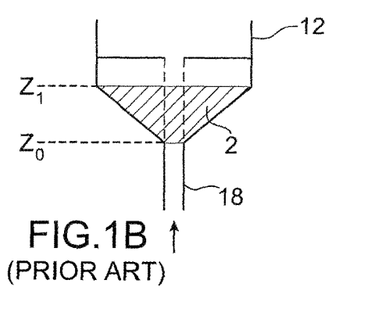

Conical profile jet spouted beds, of the type represented schematically in FIG. 1B, are conventionally used for the implementation of powders that are difficult to fluidise, in the sense of Geldart. Numerous examples thereof are given in the prior art, for example in the documents CA 601607, U.S. Pat. No. 4,342,284, GB 1567256. This type of jet spouted bed responds well to the need for the deposition methods, in so far as the characteristics of these charges (diameter and apparent specific mass of the particles mainly), on account of the very fact of this deposition, are not significantly modified.

But, in the case where there is a constraint to implement a reduced mass of charge (case of expensive material or which could lead to a risk of criticality, for example) important edge effects become manifest. In fact, it can then not be envisaged to reduce in an ill-considered manner the diameter of the reactor, because edge effects (influences of the wall on the flow of the powder) are not negligible up to a distance to the wall substantially less than or equal to at least 10 times the diameter of the particles to be fluidised. Thus, it is not possible to reduce the reactor diameter too much without perturbing a high proportion of the flow of the powders. This type of bed is thus not optimised, since the main part of the charge, when it is reduced, is then situated in the conical part 2, of volume $V_o$, between these dimensions $Z_0$ and $Z_1$ of FIG. 1B (between the outlet orifice of the gas injection pipe 18 and the lower part of the cylindrical portion 12), which makes the conditions, during deposition, not very stable; in particular, the gas flow velocity through the particles is not constant during the deposition, due to the change of passage section.

Figure 1C:
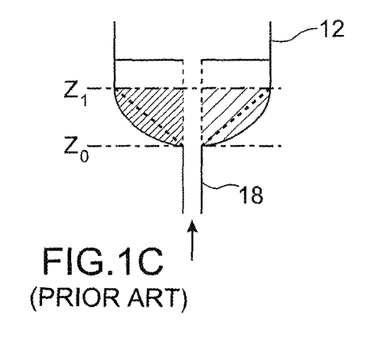

Concave profile jet spouted beds, an example of which is represented schematically in FIG. 1C, are used for generally important charges. Several industrial examples are to be noted as described in the document EP 1752991. For the case of a forced limitation of the quantity of material, this type of profile is even more unfavourable, since it maximises the volume $V_o$, for a given transition height $(Z_1-Z_0)$, defined as above, between the outlet orifice of the gas injection pipe 18 and the lower part of the cylindrical portion 12.

In certain cases, the profiles of conventional jet spouted beds described above are made more complex. Thus, it is particularly possible to implement moveable elements to aid fluidisation (case of documents EP 1 550 502 or CN 10 183 06 27 for example) or to arrange beds in series (as in US 2009/0149620). The methods of injecting fluidisation gas can also be modified to favour fluidisation (as described in RU2377487). These devices are optimised for a specific method of application, but are not very well suited for the case of an implementation of material, such as a nuclear material, not allowing frequent interventions/maintenances during the implementation of solutions as sophisticated and less robust than the simplified profiles described previously.

Moreover, as for the cases described above, these profiles do not make it possible to minimise the volume Vo, a relevant criterion particularly in the case of an implementation of a limited quantity of material, as already evoked above.

The problem is thus posed of being able to carry out one or several depositions, in particular by CVD technique, on a charge that is difficult to fluidise, particularly in the sense given by Geldart, also leading to a high risk of clogging and/or plugging, particularly at the level of the injection of gas (in other words the dimension $Z_0$).

A powder may also be considered as difficult to fluidise if the minimal gas velocity, necessary for this fluidisation, is very high and if the phenomenon is not very reproducible or at least very sensitive to slight thermohydraulic variations or characteristics of the powders; one also speaks of not very easy fluidisation when the head loss brought about by a gaseous flow through the bed to be fluidised is fluctuating, despite a slight increase in the flow velocity of the gas through the bed of powder to be fluidised.

As an example, this is the case for the manufacture of particles known as TRISO (i.e. with three layers) entering into the composition of nuclear fuels for reactors known as HTR (High Temperature Reactor). The mass of uranium that can be handled to enable an easy implementation of the charge (i.e. without risk of criticality) is then often limited to 350 or 600 g of uranium 235 (depending on the margins imposed by safety rules and depending on the isotopic enrichment of uranium implemented). One then seeks to carry out multiple depositions in the same CVD reactor, which leads to, during each successive phase of deposition, a modification of the diameter and the apparent density of the particles to be fluidised (the diameter is typically doubled during this type of deposition and the densities, on the other hand, may be reduced threefold). In this case, this important variation of characteristics of the charge during deposition (and because of the very fact of the latter) may be very disadvantageous because the conditions of fluidisation of the charges are going to be, consequently, modified. This is all the more significant when the deposition takes place in the transition volume known as $V_o$ as defined above.

3 constraints need moreover to be taken into account:
the first is the fact that the charge on which the deposition must be carried out is assumed, by virtue of said deposition, to vary significantly in terms of apparent density and granulometry,
the second resides in the fact that the charge on which the deposition has to be carried out is necessarily of limited mass, due to the fact that this charge is, for example, very expensive and/or liable to lead to a risk of criticality,
the third resides in the desire to limit the risks of plugging at the bed/emerging gas injector interface.

One thus seeks a specific profile of reactor making it possible, preferably at one and the same time, to:
limit the transition volume Vo (volume of the bed situated between the dimensions $Z_0$ and $Z_1$ in the diagrams of FIGS. 1B and 1C),
and/or to minimise what are called dead areas of the bed and the gaseous phase used for the deposition,
and/or to limit head losses while guaranteeing a sufficient fluidisation with respect to the charge.

No known structure of jet spouted bed exists that responds to this complex problem.

The present invention thus proposes resolving the problem posed.

It is posed particularly with great acuteness in the case of the manufacture of multilayer fuel particles used in HTR type nuclear reactors.

DESCRIPTION OF THE INVENTION

A jet spouted bed reactor is described herein, comprising a cylindrical area, a single gas injection pipe at the base of the cylindrical area, and a transition area, connecting the upper end of the pipe to the base of the cylindrical area, this transition area having a predominantly convex profile in a plane extending through the axis of flow of a fluid in the pipe.

The profile may have areas of convexity and areas of non-convexity; but the areas of convexity are predominant, in other words that their areas (or volumes if 3D is considered) as defined, compared to the hollowing out of a conical straight profile, are greater than those of non-convex areas.

One thus describes a new transition profile between the injection section of the gas of the jet spouted bed and the cylindrical terminal section (or lower) of the reactor, which makes it possible to minimise the volume of solid to be fluidised which is not comprised in the cylindrical section (volume Vo). This makes it possible to render the bed of powder to be coated less sensitive, during the deposition, to changes of density $\rho$ and of granulometry d and leads to a better control of the deposition throughout the whole process.

As already explained above, the evolution of these parameters of density $\rho$ and of granulometry d leads to an evolution of the deposition conditions and, thus, adjustments of the implementation conditions of the method, except if one is capable of accompanying this evolution to control directly the deposition, which is very awkward and leads to behavioural instabilities of the bed. But the thermohydraulic conditions are not constant and are sometimes chaotic and it is preferable to have a jet spouted bed reactor profile that smoothes out as best as possible these fluctuations. The best thing is then to work in the cylindrical area (i.e. above Vo) since it involves the most optimised shape, i.e. the least sensitive to the evolution of the diameters of the particles and the apparent densities thereof vis-à-vis the deposition conditions.

The type of profile proposed in the present application enables a rapid but efficient transition and particularly without creation of dead volume, between the gas injection section, enabling the fluidisation by jet, and the cylindrical section of the deposition reactor.

Furthermore, this type of profile enables a minimisation of the risks of plugging (or the risks of particle/wall/injector sticking) at the level of the gas injector of the jet spouted bed.

In fact, in the case of a convex bed, the section of the passage, just after the outlet of the gas injection pipe, is more restricted than in the case of a concave or flat profile.

It ensues that the velocity of gas, at the outlet of the gas injection pipe, is greater in the case of a bed with a convex profile than in the case of a bed with a concave or conical profile. Thus, for a same flow rate of injected gas, the gas flow velocity as well as the velocity of the particles at the level of the gas injector will be greater with a convex profile. In the case of the example of particles known as TRISO, the injected gas contains particularly the carbon precursor to be deposited on the particles.

The angle β between the axis (YY') of flow of a fluid in the pipe and the tangent to the convex profile, at the point where it joins the pipe, is preferably at least equal to 5°, and, preferably, less than 45°, and even more preferentially, comprised between 10° and 35°.

The convex profile may have a point of inflexion; in this case, one forms an angle $\theta_1$ between, on the one hand, an axis perpendicular to the direction of flow of a fluid and extending through the base of the cylindrical part and, on the other hand, the tangent to the point of inflexion I of the convex profile, preferentially greater than 10° and/or greater than the angle of spontaneous flow of the powder constituting the bed to be fluidised on an inclined plane.

Preferably the angle $\theta_2$ between, on the one hand, an axis perpendicular to the direction of flow of a fluid and extending through the base of the cylindrical part and, on the other hand, a straight line extending through the end of the gas injection pipe and through the base of the cylindrical part, is less than 90° and/or greater than the angle of spontaneous flow of the powder constituting the bed to be fluidised on an inclined plane.

A distance, between the end of the gas injection pipe and the base of the cylindrical section of the reactor, will preferably be chosen greater than ⅒ of the radius of the bed in this cylindrical section.

The convex profile may further be defined by a succession of N (N≥2) straight line segments (dn) of which none is vertical.

A method of fluidising particles of a bed of particles may comprise the implementation of a jet spouted bed reactor as above. Advantageously, the particles, or at least a part of them, have a diameter greater than or equal to 100 μm or to 500 μm, or close to one of these values, and/or the difference in specific mass between the fluidisation gas and the powder to be fluidised being greater than or equal to 0.1 g/cm³ or to 0.5 g/cm³ or 1 g/cm³ or 5 g/cm³.

It is possible particularly to carry out a plurality of successive depositions on said particles, for example with a gas of a first nature, then a gas of a second nature, different to the first.

For example, the particles comprise multilayer fuel particles used in HTR type nuclear reactors.

BRIEF DESCRIPTION OF DRAWINGS

Embodiments of the invention will now be described, by way of non-limiting examples, while referring to the appended drawings, in which.

DETAILED DESCRIPTION OF PARTICULAR EMBODIMENTS

An example of a new profile of injection section is described with reference to FIG. 2A.

In this figure may be recognised schematically the structure of a part 12, with cylindrical section, of a fluidised bed and the injection area 14 in this cylindrical part.

As may be seen in this figure, this injection area 14 does not have a right angle, or conical, or concave profile, as described above with reference to FIGS. 1A-1C. Examples of dimensioning, and particularly of the height $h_1$ and the internal diameter $d_2$ (=2×$r_2$) of the cylindrical section 12 are given hereafter. More generally:

the height $h_1$ is, preferably, greater than one tenth of the radius $r_2$ and/or less than 5 times $d_2$.

Figure 2A:
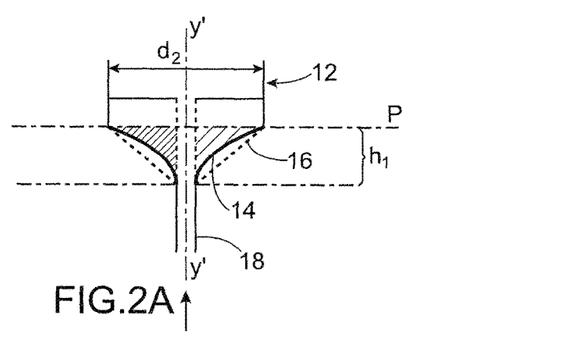
FIG. 2A is a schematic view, in transversal section, of a jet spouted bed with a new profile, according to the invention, comprising in this example a point of inflexion, for the gas injection section of a jet spouted bed and the cylindrical terminal section of a reactor.
Figure 2B:
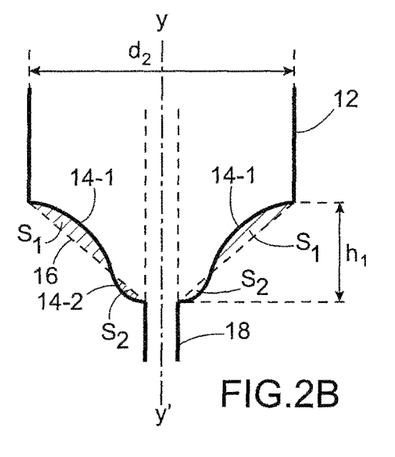
FIG. 2B is a schematic view, in transversal section, of a variant of a jet spouted bed with a new profile, according to the invention, comprising an area of convexity and an area of non-convexity.

The representations of FIGS. 2A and 2B must be taken as being with symmetry of revolution around the vertical axis YY', which merges with the axis of the gas supply pipe 18. The depiction in FIG. 2A is of a predominantly convex curved profile comprising one curved surface. The depiction in FIG. 2B is of a predominantly convex curved profile comprising two curved surfaces.

The injection area 14 has, in a plane containing the axis YY', a convex profile, with the convexity turned towards the exterior of the device. By way of comparison, in dotted lines, a conical profile 16 is represented, which starts from the outlet of the gas supply pipe 18 and which joins the base or the lower end of the cylindrical part 12. It may be noted that, generally speaking, the convex profile 14 is situated "above" the conical profile 16.

FIG. 2B represents a profile variant according to the invention. In this figure, identical references to those of FIG. 2A designate identical or corresponding elements. It may be seen in this FIG. 2B that the profile 14 may, in a plane containing the axis YY', not only be convex, but that it may have areas 14-1 of convexity (the convexity is turned towards the exterior of the device) and areas 14-2 of non-convexity (in other words not having convexity turned towards the exterior of the device). The areas of on convexity are predominant, in other words the sum of the hatched surfaces S1 (or volumes if 3D is considered) comprised between the profile of the convex areas 14-1 and the conical straight profile 16 (already defined above) is strictly greater than the sum of the hatched surfaces S2 (or volumes if 3D is considered) comprised between the profile of the non-convex areas 14-2 and the conical straight profile 16.

In other words, the volume (hatched in FIG. 2A), defined between the plane P that passes through the lower end of the cylindrical part 12 and the plane P' that passes through the upper end of the gas supply pipe 18 is, in the case of the convex, or predominantly convex, profile less than it is in the case of a conical profile, and, consequently, than it is in the case of a right angle profile or in the case of a concave profile.

The new profile proposed thus makes it possible to minimise the volume of solid to be fluidised which is not comprised in the cylindrical section (volume $V_0$), while enabling an efficient fluidisation. This makes it possible, particularly in the case of a powder intended to form a coating, to render the bed of powder less sensitive to changes of density ρ and of granulometry d during the deposition and thereby enables a better control of the deposition throughout the whole process.

Figure 6:
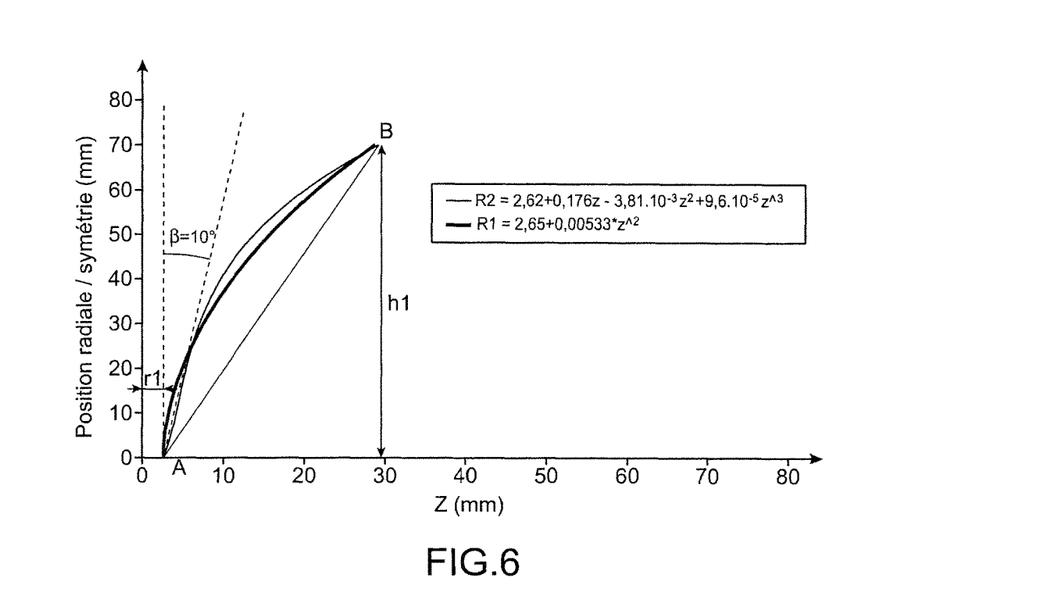
FIG. 6 represents examples of profiles of an injection section with convex profile.

Examples of profiles reproducing the section 14 are given in FIG. 6.

Each of these profiles follows an equation:

$$R_1 = 2.65 + 0.00533 z^2;$$

$$R_2 = 2.62 + 0.176 z - 3.81 \times 10^{-3} z^2 + 9.6 \times 10^{-5} z^3;$$

Unlike these two examples, a convex profile cannot always be expressed in the form of an equation.

Figure 5:
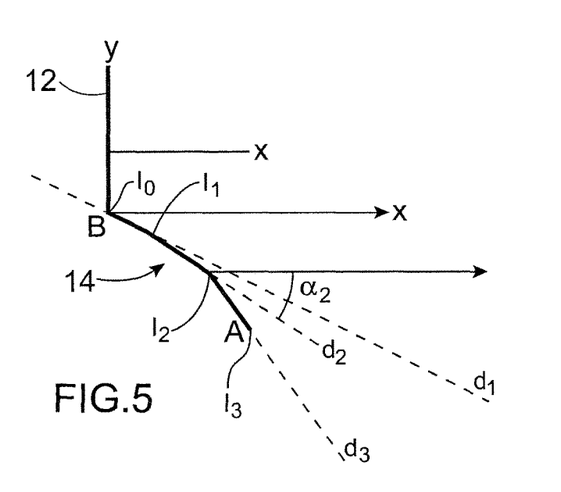
FIG. 5 represents an injection section with convex profile, approached by a set of straight lines segments.

It is also possible to form a convex, or predominantly convex, profile by a succession of straight line segments, as illustrated in FIG. 5.

The convex, or predominantly convex, profile is then formed by a succession of N (N>1 or N>2 or N>5) straight line segments $d_n$ (n=0, 1, . . . N), each segment being comprised between two ends $I_n$, $I_{n+1}$; $I_n$ is thus the point of intersection between these straight lines segments $d_n$ and $d_{n-1}$ with the following expression of the straight line $d_n$ (n being ≥1):

$$Y(n) = \frac{y_n - y_{n-1}}{x_n - x_{n-1}} \cdot x + y_n - \left(\frac{y_n - y_{n-1}}{x_n - x_{n-1}}\right) \cdot x_{n-1}$$

with $y_n$ and $x_n$ the coordinates of the point $I_n$ in the reference point (x,y) as defined in FIG. 5, the Y axis being merged with the projection, in the plane YX, of the lateral part of the cylindrical body 12, and the X axis being perpendicular to the Y axis and extending through the point B of intersection between the cylinder 12 and the convex portion 14. The origin $I_0$ is situated at the intersection of these two axes.

In this representation, the angle $\alpha_n$ formed between the straight line $d_n$ and the horizontal (the axis $I_0X$) is defined by the following expression $$\tan \alpha_n = -\frac{y_n - y_{n-1}}{x_n - x_{n-1}}$$

As will be seen hereafter, it is preferable to adopt the following constraint on the angle α (or $\alpha_n$):

α>10° except for n=1
and $\alpha_n$<80° for n=N (with N≥2)

The values of the parameters of the profiles may be optimised as a function of the desired minimisation of the volume $V_0$.

This gain may be defined by the expression below, by considering a zero gain when the convex profile is superimposed on the conical profile (or profile standard):

$$\text{Gain} = \frac{(V_0^P - V_0^{Cone})}{V_0^{Cone}}$$

where $V^P_0$ and $V^{Cone}_0$ represent, respectively, the volume $V_0$ for the case of a profile (here: convex) P and for the case of a flat profile, equivalent to a truncated cone.

Given that $$V_0^P = \pi \int_0^{Z0} |f(x)|^2 dx$$

with f(x) being the function of the profile P considered as a function of the coordinate x, it is then possible to estimate the gain in volume for a given profile compared to that of a flat profile.

For the convex profiles R1 and R2 already mentioned and illustrated in FIG. 6, the gain is close to 30%, which represents a significant value.

Figure 3:
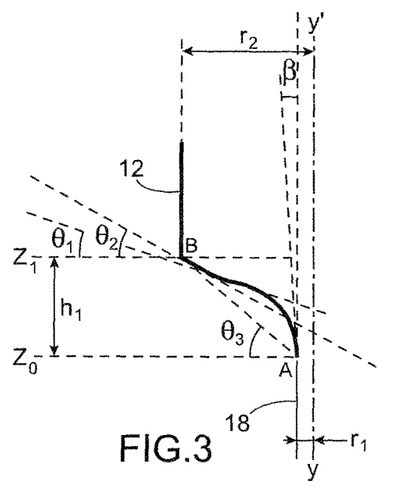
FIG. 3 is a detailed view, in transversal section, of a jet spouted bed with a new profile for the gas injection section of a jet spouted bed and the cylindrical terminal section of a reactor.

In a detailed manner, in FIG. 3, are represented a portion of the cylindrical area 12, the gas supply pipe 18, and the convex section 14 that connects them, between a point A, situated in the upper part of the pipe 18, the point B, which corresponds to the intersection between the lower part of the cylindrical area 12 and the convex profile 14.

One defines, in a vertical plane, which contains the axis yy' of injection of gases, the following angles, which are going to make it possible to characterise a little more convex, or predominantly convex, profiles particularly adapted within the scope of the present invention:

$\theta_1$ is the angle formed between:
  a horizontal axis that extends through a point B of the lower end section of the cylindrical portion 12;
  and the tangent to the point of inflection I of the convex, or predominantly convex, profile in the case where such a profile has at least one zero second derivative point;

$\theta_2$ is the angle formed between:
  the horizontal axis that has been defined
  and the tangent to the convex profile, at the point B;

$\theta_3$ is the angle formed between the same horizontal axis and a conical profile at the point A (point situated on the circumference of the outlet of the gas injection pipe 18); this conical profile is represented in dotted lines in FIG. 3 and connects the point A to the point B;

β is the angle formed between the vertical axis YY' and the tangent to the convex profile, at the point A.

As regards the dimensions, there is, in this figure:
  the radius $r_1$, which is the injection radius of the gas injection pipe;
  the radius $r_2$, radius of the fluidised bed in the cylindrical part 12 of the jet spouted reactor; it corresponds substantially to the radius of the cylindrical part, in a plane perpendicular to the axis YY';

the height $h_1$, or transition height between the dimension of the gas injection (dimension $Z_0$), and that from which the section of the bed is constant along the vertical axis (dimension $Z_1$).

The convex, or predominantly convex, profile of the reactor is preferably chosen in the following manner, which favours the fluidisation of the solid charge.

In particular, the appearance of a vault or of an arch of solid material may be difficult to break if the profile retained is too convex, particularly if the value of the angle $\beta$ (angle between the vertical and the tangent to the profile of the reactor) is too small.

Figure 4A:
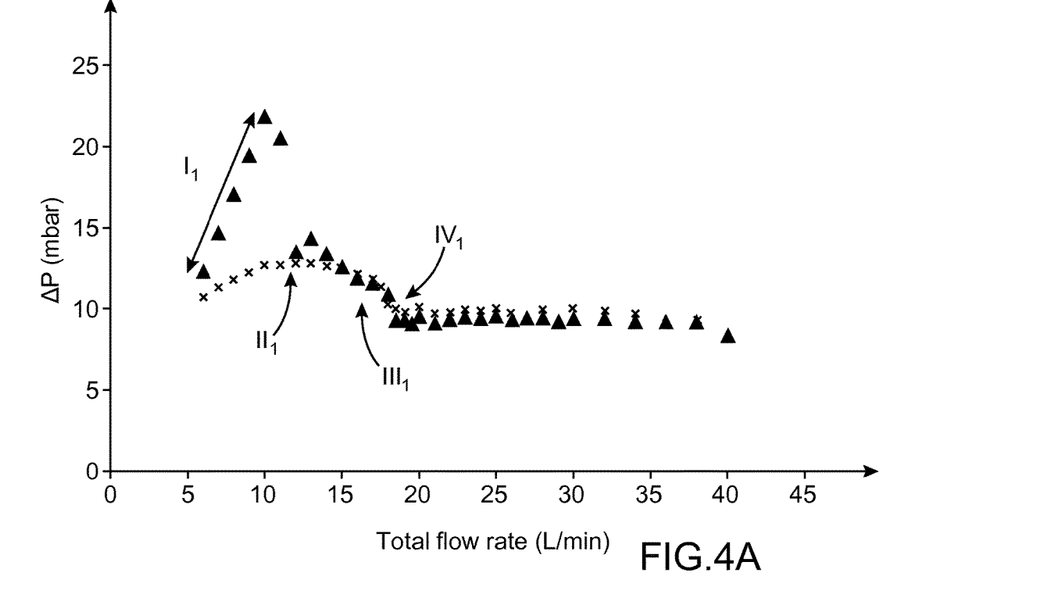
FIGS. 4A and 4B are comparisons, for a same granular charge (in terms of mass and physical characteristics), of the evolution of the head loss through a known bed with linear profile (FIG. 4A) and a bed with an injection section with convex profile with a β angle=0 (FIG. 4B)
Figure 4B:
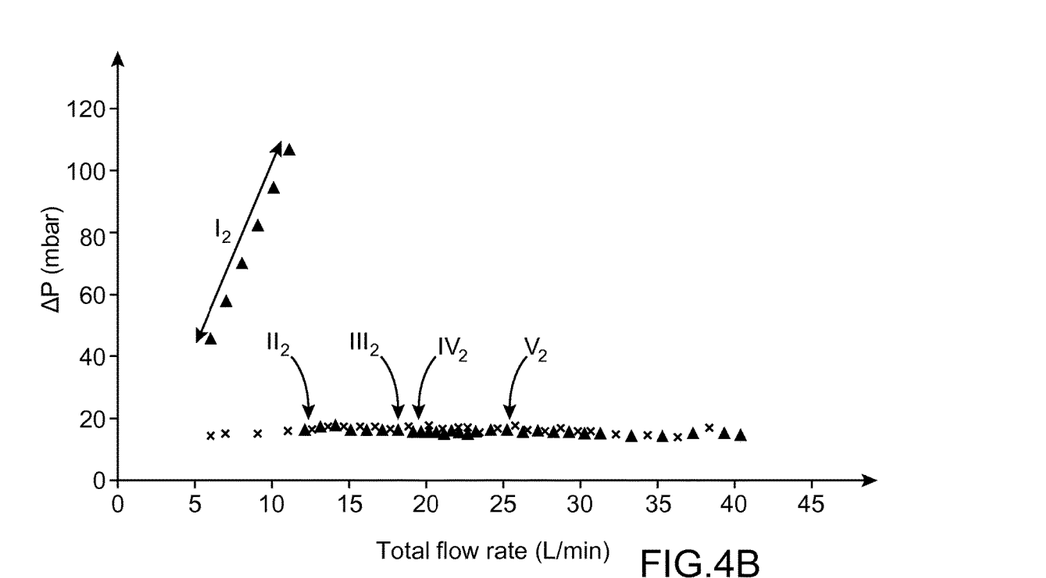

FIGS. 4A and 4B are comparisons, for a same granular charge (in terms of mass and physical characteristics: monomodal powder with a density d=500 μm and a specific mass $\rho$=5.9 g/cm$^3$), of the evolution of the head loss through:

a bed with known linear profile (FIG. 4A), conical, with $\theta_3$=60°;

and a bed with an injection section with convex profile with an angle $\beta$=0 (FIG. 4B).

Figure 4C:
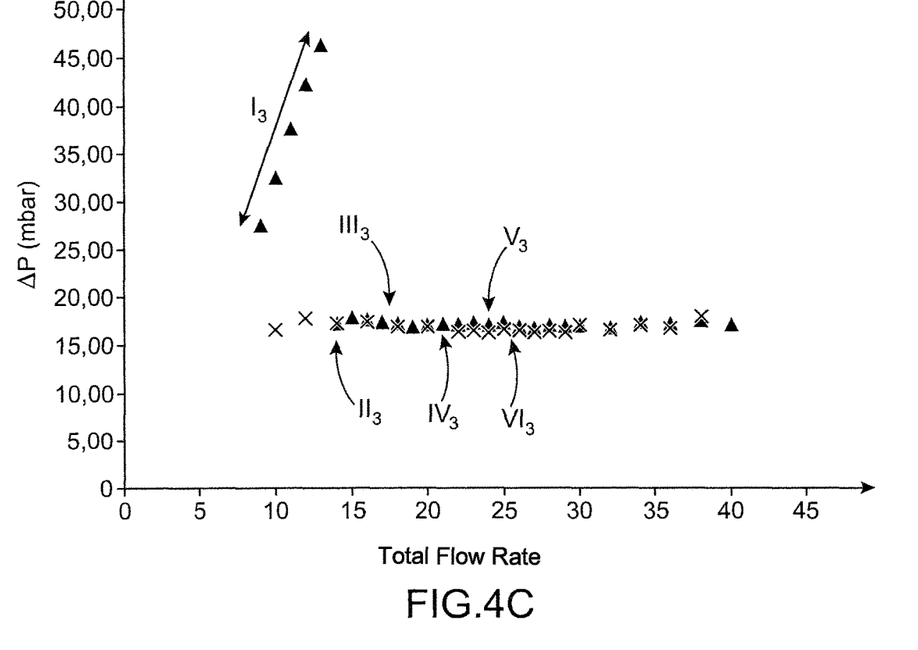
FIG. 4C represents the evolution of the head loss through a bed with an injection section with convex profile, for a β angle value=10°.

FIG. 4C represents the evolution of the head loss through a bed with an injection section with convex profile, for a $\beta$ angle value=10°, for a powder having the same characteristics as above.

In these 3 diagrams, the black triangles correspond to the case of an increasing flow rate, and the crosses to the case of a decreasing flow rate.

In the case of a conical profile (FIG. 4A) one distinguishes successively a regime $I_1$, called "fixed bed", a regime $II_1$, for which the lower part of the bed is in movement, a regime $III_1$ called irregular fountain, followed by a regular fountain regime $IV_1$.

In the case of a convex profile, with $\beta$=0 (case of a profile tangent to the vertical), one has successively a regime $I_2$, known as "fixed bed", a regime $II_2$, for which the lower part of the bed is in movement, a regime $III_2$ of surface eddies, a regime $IV_2$ of irregular piercings, and a regime $V_2$ called irregular and turbulent fountain. It has been able to be shown that, for a dense charge (for d>6) and of granulometry close to 500 μm, fluidisation is difficult, which may be seen in FIG. 4B. This may, in particular, result in an important increase (up to more than 100 mbar for a bed height close to 70 mm) of the head loss as a function of the increase in the flow rate of injected gas (it is the regime $I_2$, known as "fixed bed") comparatively to which may be noted with a more hollowed out or even conical profile (case of FIG. 4A).

Furthermore, the fountain generated by the injection of gas, in the case of a convex profile, is more unstable. A minimal value of $\beta$ exists to obtain a fluidisation considered satisfactory, in stable regime.

In FIG. 4C is represented the evolution of the head loss through a bed with an injection section with convex profile, for a $\beta$ angle value=10°. It may be seen that, as a function of the flow rate, the head loss is relatively regular, whether the flow rate is increasing or decreasing. Moreover, the equivalent head loss, in the regime $I_3$ called fixed bed, is indeed less than for the case where $\beta$=0°, which denotes a better behaviour to fluidisation in the case of this profile $\beta$=10°, hence the recommendation of having a $\beta$ angle at least equal to 10°.

In this diagram is indicated, successively, the region $II_3$ of the first piercing of the bed, the area $III_3$ of appearance of surface eddies, a region $IV_3$ of irregular piercing, the appearance $V_3$ of bubbles at the surface, then the formation, in $VI_3$, of a regime called "fountain".

Preferably, for the parameters $\theta_1$, $\theta_2$, $\beta$, $r_1$, $r_2$ of a convex profile the following values are chosen:

$\beta$: comprised between 5° and 45°, more preferably between 10° and 35°;

and/or $\theta_1$ greater than the angle of spontaneous flow of the powder constituting the bed to be fluidised on an inclined plane (which describes the capacity of a powder to flow naturally; to do so, a heap of this powder is formed on an initially horizontal flat surface, then, the slope of this flat surface is made to vary progressively according to a greater and greater angle: the angle of spontaneous flow is that for which the powder is going to flow naturally); for example $\theta_1 \geq 10°$;

and/or $\theta_2$ greater than the angle of spontaneous flow of the powder constituting the bed to be fluidised; $\theta_2 \leq 90°$;

and/or $r_1$:5 D (where D is the diameter of the particles to be fluidised)$\leq r_1 \leq r_2/5$;

and/or $h_1$: $> r_2/10$

Figure 7A:
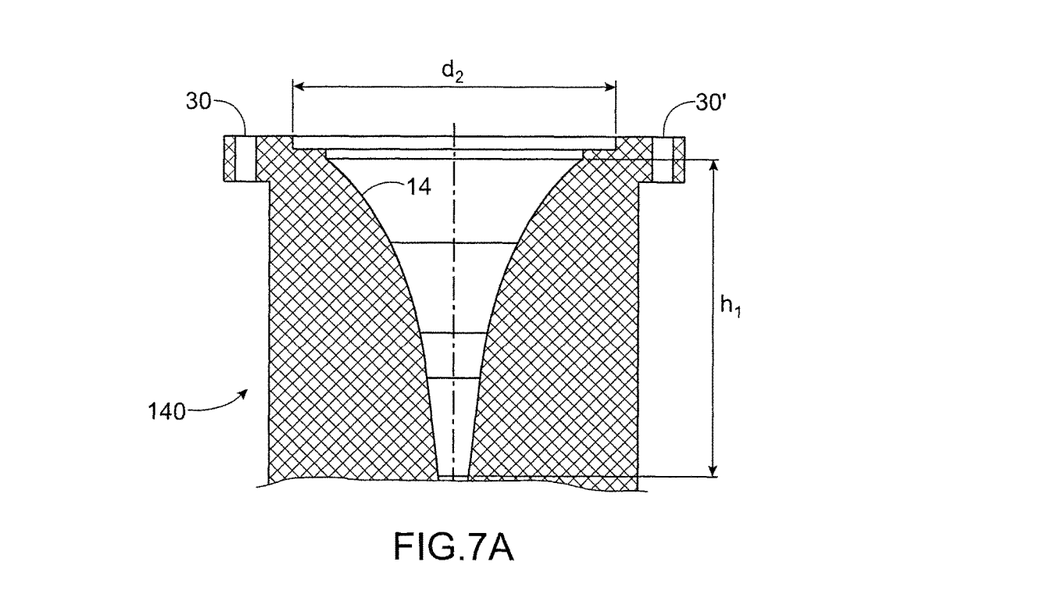
FIGS. 7A and 7B are examples of embodiment of an injection section with convex profile, FIG. 8 schematically represents a known classification of powders.
Figure 7B:
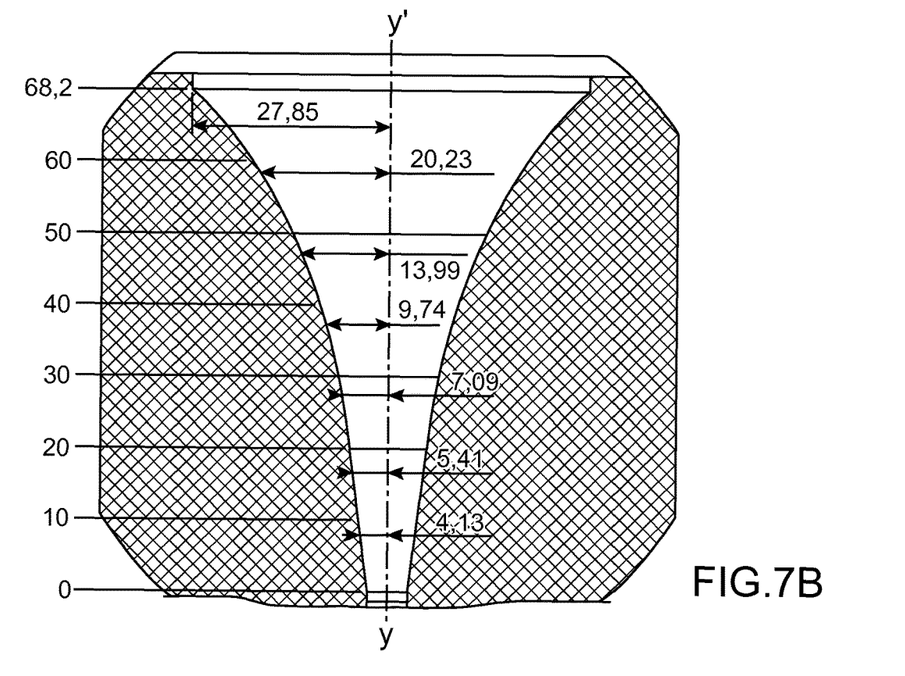

An example of convex profile formed is represented in FIGS. 7A and 7B.

It may be seen that, in this example:

$h_1$=68.2 mm;

$d_2$=2×$r_2$=70 mm.

Moreover, in FIG. 7B are represented various dimensions of the convex profile, in other words the distance, for various vertical positions, from the surface of this profile with respect to the axis YY'.

Thus it may be seen that, if one takes the origin 0 at the level of the outlet of the gas injection pipe, the distance, with respect to the axis YY', varies from several millimeters to around 20 mm, between a position close to the outlet of the gas injection pipe 18 and a position situated at around 60 mm from this outlet.

In FIG. 7A are also represented the means, here threaded holes 30, 30', which will make it possible to fix the cylindrical section 12 onto the base 140 in which the convex profile 14 has been formed.

This profile has been able to be machined in CAFM, which makes it possible to use an equation during a machining.

It has moreover been able to be tested.

It involves, in fact, the profile corresponding to equation R2, of degree 3, as already defined above.

An example of application relates to the manufacture of multilayer fuel particles used in an HTR type nuclear reactor. This type of reactor operates at high temperature, with a gaseous heat transfer fluid such as helium, the moderator being the graphite constituting the fuel.

For the manufacture of TRISO particles constituting nuclear fuel, a reactor device is implemented as has been described above (with the geometric parameters of the example given previously in FIGS. 7 A and 7B).

Successive depositions are carried out of pyrocarbon (internal PyC), then SiC, then again pyrocarbon (external PyC) on particles (known as cores) of $UO_2$ of, for example, 500 μm diameter.

The depositions are then successively carried out from acetylene and ethylene (for depositions of pyrocarbon type) and methyltrichlorosilane (for the deposition of SiC).

The flow rate of gas is of the order of 10 Nl/min for all gases, the carrier gas of the precursor (the source of pyrocarbon or SiC) being argon.

The operating temperature of the CVD reactor is comprised between 1200 and 1600° C., depending on the nature of the deposition to be carried out.

The invention claimed is:

1. Jet spouted bed reactor, comprising a cylindrical area, having a lower edge, a gas injection pipe, and a transition area, forming a bottom of the reactor, connecting an upper end of the gas injection pipe to the lower edge of the cylindrical area, this transition area having a convex curved, or predominantly convex profile in a plane containing an axis (YY') of flow of a fluid in the gas injection pipe, the convex curved, or predominantly convex curved profile comprising one or more curved surfaces.

2. Jet spouted bed reactor according to claim 1, in which an angle β between the axis of flow of the fluid in the pipe and a tangent to the convex or predominantly convex curved profile at the point where it joins the pipe is greater than or equal to 5°.

3. Jet spouted bed reactor according to claim 2, the angle β being greater than or equal to 10°.

4. Jet spouted bed reactor according to claim 3, the angle β being less than 35°.

5. Jet spouted bed reactor according to claim 2, in which an angle β between the axis of flow of the fluid in the pipe and a tangent to the convex curved or predominantly convex curved profile at the point where it joins the pipe is less than 45°.

6. Jet spouted bed reactor according to claim 1, wherein:
the convex curved or predominantly convex profile has a point of inflexion; and
an angle between, on the one hand, an axis perpendicular to the direction of the flow of the fluid and extending through the base of the cylindrical part and, on the other hand, the tangent to the point of inflexion of the convex profile, is greater than 10°.

7. Jet spouted bed reactor according to claim 1, wherein an angle between, on the one hand, an axis perpendicular to the direction of the flow of the fluid in the gas injection pipe and extending through the base of the cylindrical part and, on the other hand, a straight line extending through the end of the gas injection pipe and through the base of the cylindrical part, is less than 90°.

8. Jet spouted bed reactor according to claim 1, wherein a distance (h1) between the end of the gas injection pipe and the base of the cylindrical section of the reactor is greater than $1/10$ of the radius of the bed in this cylindrical section.

* * * * *

UNITED STATES PATENT AND TRADEMARK OFFICE
CERTIFICATE OF CORRECTION

PATENT NO. : 10,068,674 B2  
APPLICATION NO. : 14/129916  
DATED : September 4, 2018  
INVENTOR(S) : Meryl Brothier et al.

Page 1 of 1

It is certified that error appears in the above-identified patent and that said Letters Patent is hereby corrected as shown below:

In the Specification

Column 4, Line 31, "in other words that their" should be -- in other words their --.

Signed and Sealed this
Twentieth Day of November, 2018

Andrei Iancu
*Director of the United States Patent and Trademark Office*